United States Patent
Hiroki et al.

(10) Patent No.: US 9,227,320 B2
(45) Date of Patent: Jan. 5, 2016

(54) TRANSFER DEVICE AND TRANSFER METHOD

(71) Applicants: TOKYO ELECTRON LIMITED, Tokyo (JP); SANKYO SEISAKUSHO CO., Tokyo (JP)

(72) Inventors: Tsutomu Hiroki, Nirasaki (JP); Hisayoshi Ito, Kikugawa (JP)

(73) Assignees: TOKYO ELECTRON LIMITED, Tokyo (JP); SANKYO SEISAKUSHO CO., Tokyo (JP)

( * ) Notice: Subject to any disclaimer, the term of this patent is extended or adjusted under 35 U.S.C. 154(b) by 0 days.

(21) Appl. No.: 14/499,845

(22) Filed: Sep. 29, 2014

(65) Prior Publication Data

US 2015/0019004 A1 Jan. 15, 2015

Related U.S. Application Data

(63) Continuation of application No. PCT/JP2013/058829, filed on Mar. 26, 2013.

(30) Foreign Application Priority Data

Mar. 30, 2012 (JP) .................................. 2012-079076

(51) Int. Cl.
| | |
|---|---|
| G06F 7/00 | (2006.01) |
| B25J 9/16 | (2006.01) |
| H01L 21/67 | (2006.01) |
| H01L 21/677 | (2006.01) |
| H01L 21/68 | (2006.01) |

(52) U.S. Cl.
CPC .............. B25J 9/1602 (2013.01); B25J 9/1664 (2013.01); H01L 21/67259 (2013.01); H01L 21/67706 (2013.01); H01L 21/67742 (2013.01); H01L 21/68 (2013.01); H01L 21/681 (2013.01); *G05B 2219/40014* (2013.01); *G05B 2219/45031* (2013.01)

(58) Field of Classification Search
CPC .............................. A01B 12/006; B25J 9/1664
USPC ............................................................ 700/228
See application file for complete search history.

(56) References Cited

U.S. PATENT DOCUMENTS

| | | | |
|---|---|---|---|
| 8,135,486 B2* | 3/2012 | Shindo | H01L 21/67259 356/400 |
| 2010/0008688 A1* | 1/2010 | Kimura | H01L 21/68 399/66 |
| 2010/0030347 A1* | 2/2010 | Shindo | H01L 21/67259 700/59 |

FOREIGN PATENT DOCUMENTS

| | | |
|---|---|---|
| JP | 10-064971 A | 3/1998 |
| JP | 11-297788 A | 10/1999 |
| JP | 2011-167828 A | 9/2011 |

OTHER PUBLICATIONS

International Search Report dated May 21, 2014, for corresponding application No. PCT/JP2013/058829.

*Primary Examiner* — Kyle Logan
(74) *Attorney, Agent, or Firm* — Nath, Goldberg & Meyer; Jerald L. Meyer (57) ABSTRACT

A transfer device includes: a transfer unit configured to transfer a substrate from a transfer original position to a corrected transfer destination position; a plurality of position detecting units installed between the transfer original position and the corrected transfer destination position and configured to detect a position of the substrate which is being transferred by the transfer unit; and a control unit configured to calculate the corrected transfer destination position by correcting an initial transfer destination position set at the start of the transfer of the substrate, based on the position of the substrate detected by the position detecting units, before the substrate is transferred to the initial transfer destination position, and configured to control the transfer unit to transfer the substrate to the corrected transfer destination position along a transfer path produced by modifying an initial transfer path.

6 Claims, 9 Drawing Sheets

TRANSFER DEVICE AND TRANSFER METHOD

CROSS-REFERENCE TO RELATED APPLICATIONS

This application is a Continuation application of PCT International Application No. PCT/JP2013/058829, filed Mar. 26, 2013, which claimed the benefit of Japanese Patent Application No. 2012-079076, filed Mar. 30, 2012, the entire content of each of which is hereby incorporated by reference.

TECHNICAL FIELD

Embodiments of the present disclosure relates to a transfer device and a method of transferring a substrate.

BACKGROUND

There is a transfer device for transferring a substrate such as a semiconductor substrate in a processing system for processing the substrate. The transfer device includes a blade driven by arms. The substrate is mounted on the blade and is transferred with movement of the blade. The transfer device also includes a position detecting sensor for detecting a position of the substrate mounted on the blade. The transfer device corrects a transfer destination position based on detection results obtained at the position detecting sensor, such that the substrate is transferred to the corrected position.

In such a transfer device, once the transfer destination position of the substrate is corrected based on the detection results obtained at the position detecting sensor, in general, the transfer device first transfers the substrate up to an initial transfer destination position set at the start of the transfer of the substrate. Thereafter, the transfer device corrects the position of the substrate by moving the substrate from the initial transfer destination position to the corrected position based on the detection results obtained at the position detecting sensor. However, in such a method, the correction is digitally performed due to mechanical properties of the transfer device, which allows a movement trajectory of the substrate to be digitized. This makes it difficult to control the movement of the substrate with high precision. As such, in the related art, there is a need to transfer the substrate with high precision.

SUMMARY

The present disclosure provides some embodiments of a transfer device which is capable of transferring a substrate with high precision. The present disclosure also provides some embodiments of a method of transferring a substrate with high precision.

According to one embodiment of the present disclosure, there is provided a transfer device including a transfer unit, a plurality of position detecting units and a control unit. The transfer unit is configured to transfer a substrate from a transfer original position to a corrected transfer destination position. The position detecting units are installed between the transfer original position and the corrected transfer destination position and are configured to detect a position of the substrate transferred by the transfer unit during the transfer. The control unit is configured to calculate the corrected transfer destination position by correcting an initial transfer destination position set at the start of the transfer of the substrate based on the position of the substrate detected by the position detecting units, before the substrate is transferred to the initial transfer destination position. Subsequently, the control unit controls the transfer unit to transfer the substrate to the corrected transfer destination position along a transfer path produced by modifying an initial transfer path which is oriented from the transfer original position to the initial transfer destination position.

According to another embodiment of the present disclosure, there is provided a method of transferring a substrate from a transfer original position to a corrected transfer destination position using a transfer unit, which includes: detecting a position of the substrate transferred by the transfer unit during the transfer of the substrate; correcting an initial transfer destination position based on the position of the substrate detected at the detecting, before the substrate is transferred to the initial transfer destination position, and calculating the corrected transfer destination position, the initial transfer destination position being set at the start of the transfer of the substrate; and controlling the transfer unit such that the substrate is transferred to the corrected transfer destination position along a transfer path produced by modifying an initial transfer path which is oriented from the transfer original position to the initial transfer destination position.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Embodiments of the present disclosure will now be in detail described with reference to the accompanying drawings. Throughout the drawings, the same or similar elements are denoted by the same reference numerals. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
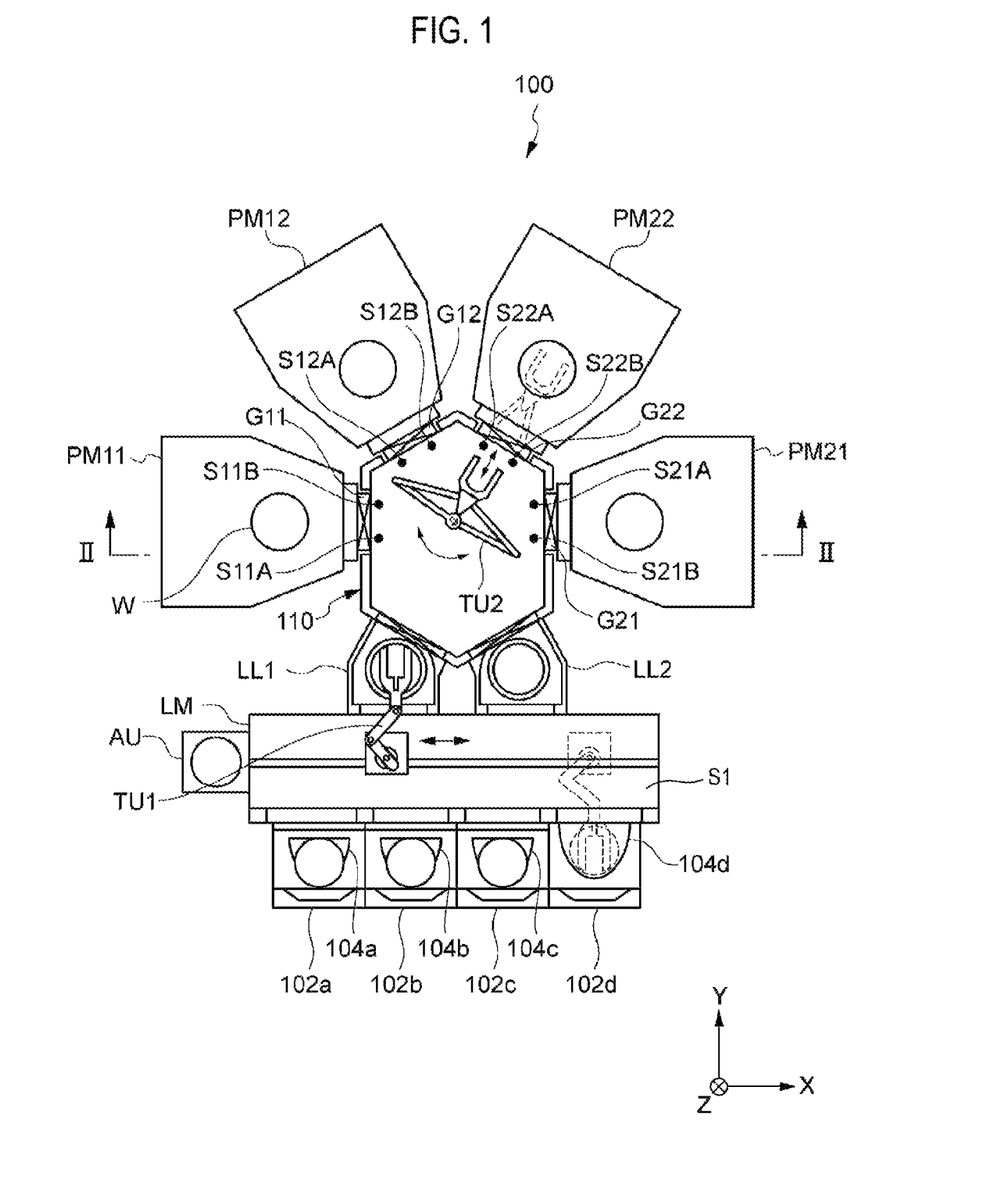
FIG. 1 is a plan view showing a processing system including a transfer device according to one embodiment.

FIG. 1 is a plan view showing a processing system according to one embodiment, when viewed from the top in a normal state of use. In the following description, a direction in which a plurality of mounting tables connected to a loader module in the below-mentioned embodiments is arranged will be defined as the X-direction. A height direction in a normal state of use of the processing system will be defined as the Z-direction. A direction intersecting or orthogonally intersecting the Z-direction and X-direction will be defined as the Y-direction.

The processing system 100 shown in FIG. 1 is a system configured to process a substrate W to be processed. The processing system 100 includes a plurality of mounting tables 102a to 102d, containers 104a to 104d, loader module LM, an alignment unit AU, load lock chambers LL1 and LL2, process modules PM11, PM12, PM21 and PM22, and a transfer chamber (transfer device) 110. At least one of the process modules PM11, PM12, PM21 and PM22 is coupled to the transfer chamber 110.

The mounting tables 102a to 102d are arranged in the X-direction along an edge of one side of the loader module LM in the Y-direction. The containers 104a to 104d are respectively mounted on the mounting tables 102a to 102d. Substrates W are accommodated within the containers 104a to 104d.

The alignment unit AU is disposed at an edge of one side of the loader module LM in the X-direction. The alignment unit AU is configured to measure a deviation of the center position of the substrate W which is transferred into the alignment unit AU. Specifically, the alignment unit AU rotates the substrate W transferred thereinto and detects an outer edge of the substrate W using a sensor, thereby obtaining a deviation of a rotational center position of the substrate W from the actual center position of the substrate W. This makes it possible to detect whether the substrate W has deviated from the center of a rotary table for rotating the substrate W by a certain degree of deviation.

In one embodiment, the loader module LM has a substantially box shape longer in the X-direction than in the Y-direction. The loader module LM includes a chamber wall that defines therein a transfer space S1 kept in an atmospheric pressure state. The loader module LM includes a transfer unit TU1 installed in the transfer space S1. The transfer unit TU1 of the loader module LM takes the substrate W out of one of the containers 104a to 104d and transfers the taken-out substrate W to the alignment unit AU. In addition, the transfer unit TU1 of the loader module LM takes the substrate W out of the alignment unit AU to correct the deviation of the center position of the substrate W obtained at the alignment unit AU and transfers the substrate W to one of the load lock chambers LL1 and LL2.

The load lock chambers LL1 and LL2 are arranged in the X-direction along an edge of the other side of the loader module LM in the Y-direction. In addition, the transfer chamber 110 is placed in the other side of the loader module LM in the Y-direction. As shown in FIG. 1, the load lock chambers LL1 and LL2 are installed between the loader module LM and the transfer chamber 110.

The load lock chambers LL1 and LL2 are used as preliminary decompression chambers within which the substrate W transferred thereto from the loader module LM stays before they are moved to the transfer chamber 110 whose internal transfer space S2 is kept in a decompressed or vacuum state. Openable/closable gate valves are respectively installed between the load lock chamber LL1 and the loader module LM, between the load lock chamber LL1 and the transfer chamber 110, between the load lock chamber LL2, and the loader module LM and between the load lock chamber LL2 and the transfer chamber 110.

The transfer chamber 110, which includes depressurizable transfer space defined therein, transfers the substrate W to any one of the process modules PM11, PM12, PM21 and PM22.

Openable/closable gate valves G11, G12, G21 and G22 are respectively installed between the transfer chamber 110 and the process modules PM11, PM12, PM21 and PM22.

The process modules PM11 and PM12 are arranged in the Y-direction along an edge of one side of the transfer chamber 110 in the X-direction. The process modules PM21 and PM22 are arranged in the Y-direction along an edge of the other side of the transfer chamber 110 in the X-direction. Each of the process modules PM11, PM12, PM21 and PM22 processes the substrate W accommodated therein. Examples of the processing performed by each of the process modules PM11, PM12, PM21 and PM22 may include etching, film-forming, ashing, sputter film-forming, chemical oxide removal, and so on.

In the processing system 100 of the embodiment shown in FIG. 1, the substrate W accommodated within one of the container 104a to 104d is transferred to one of the process modules PM11, PM12, PM21 and PM22 via the loader module LM, the alignment unit AU, the load lock chamber LL1 or LL2, and the transfer chamber 110. One of the process modules PM11, PM12, PM21 and PM22 may be defined as a transfer destination process module where the substrate W is processed. The substrate W, which has been subjected to the above-described processing in the transfer destination process module, is returned to the loader module LM via the transfer chamber 110 and the load lock chamber LL1 or LL2.

Figure 2:
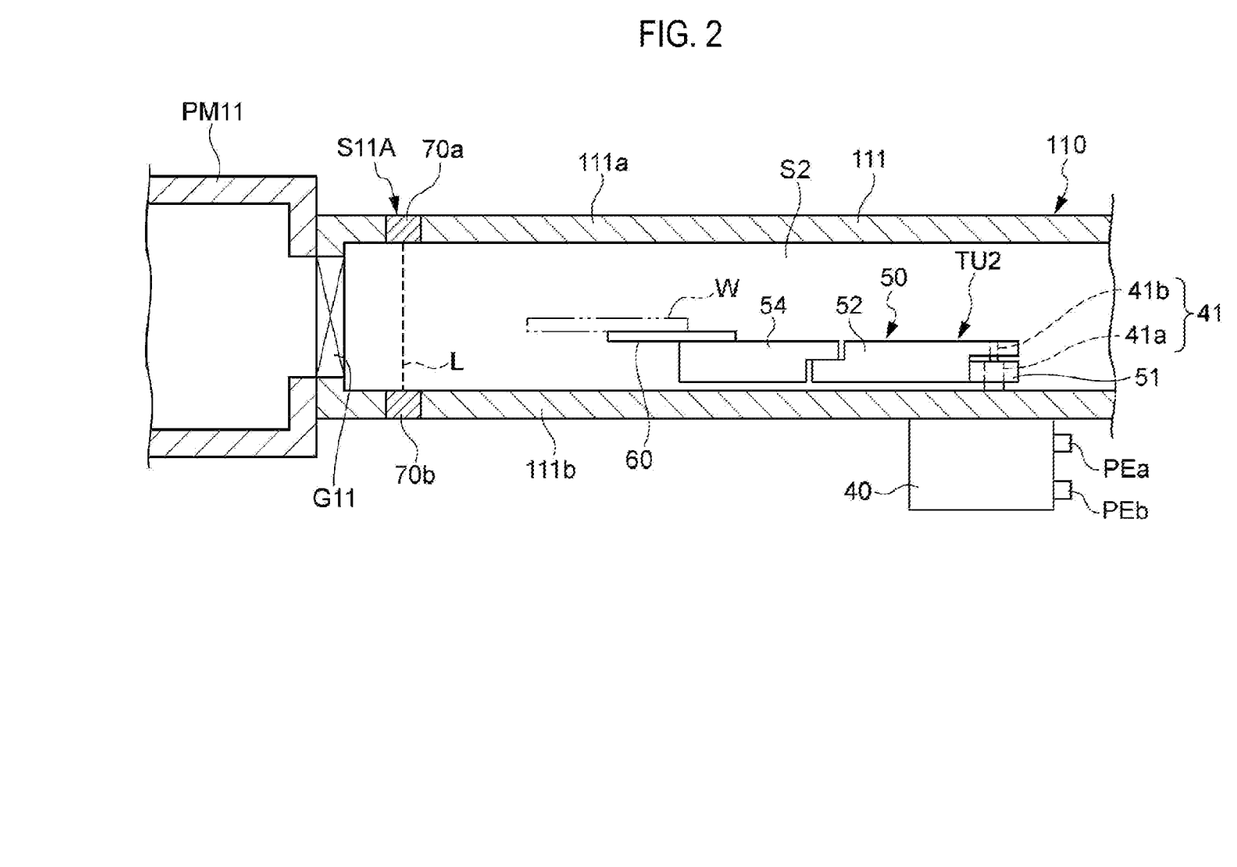
FIG. 2 is a sectional view taken along line II-II in FIG. 1.
Figure 3:
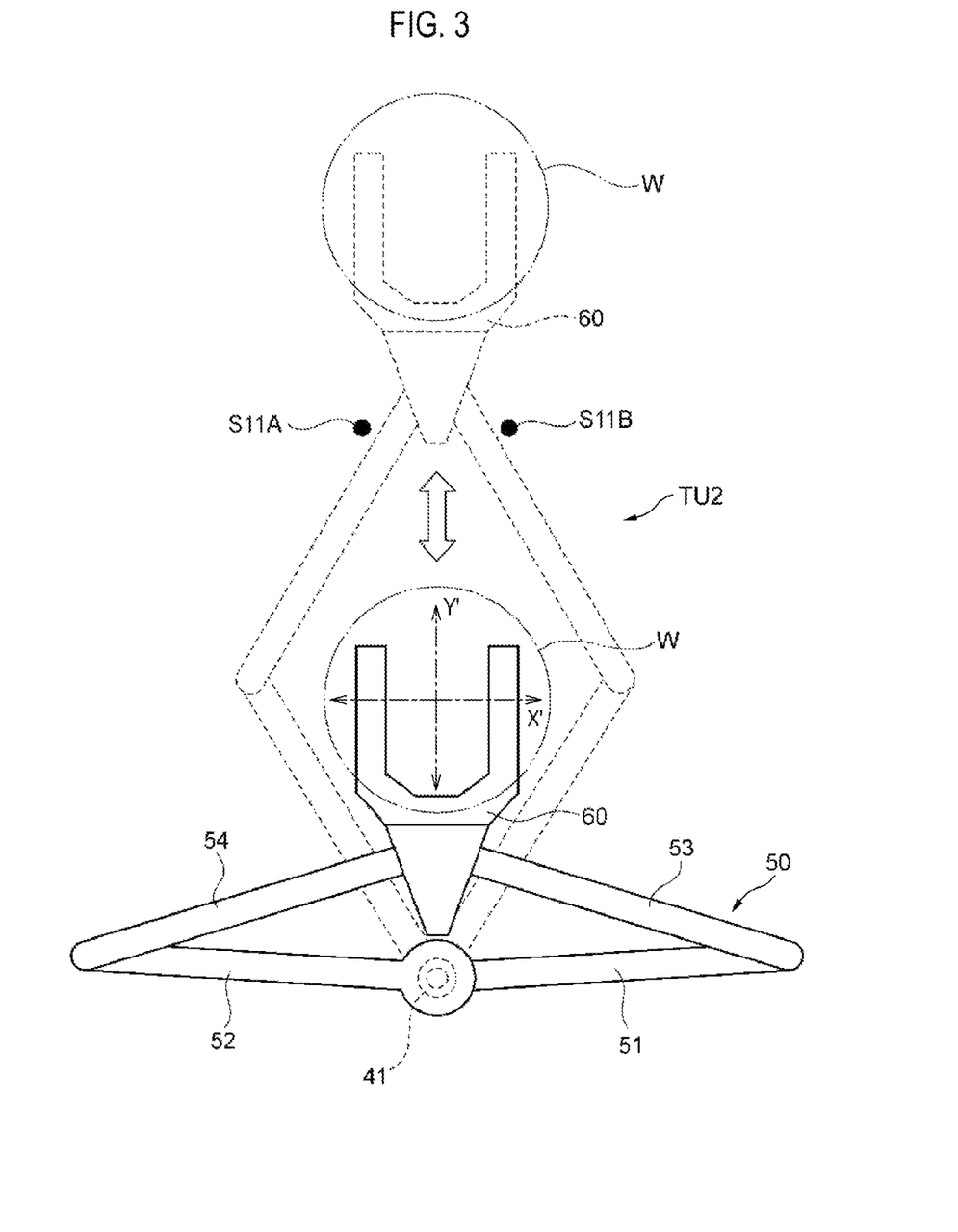
FIG. 3 is a plan view showing operations of arms of a transfer device according to some embodiments.
Figure 4:
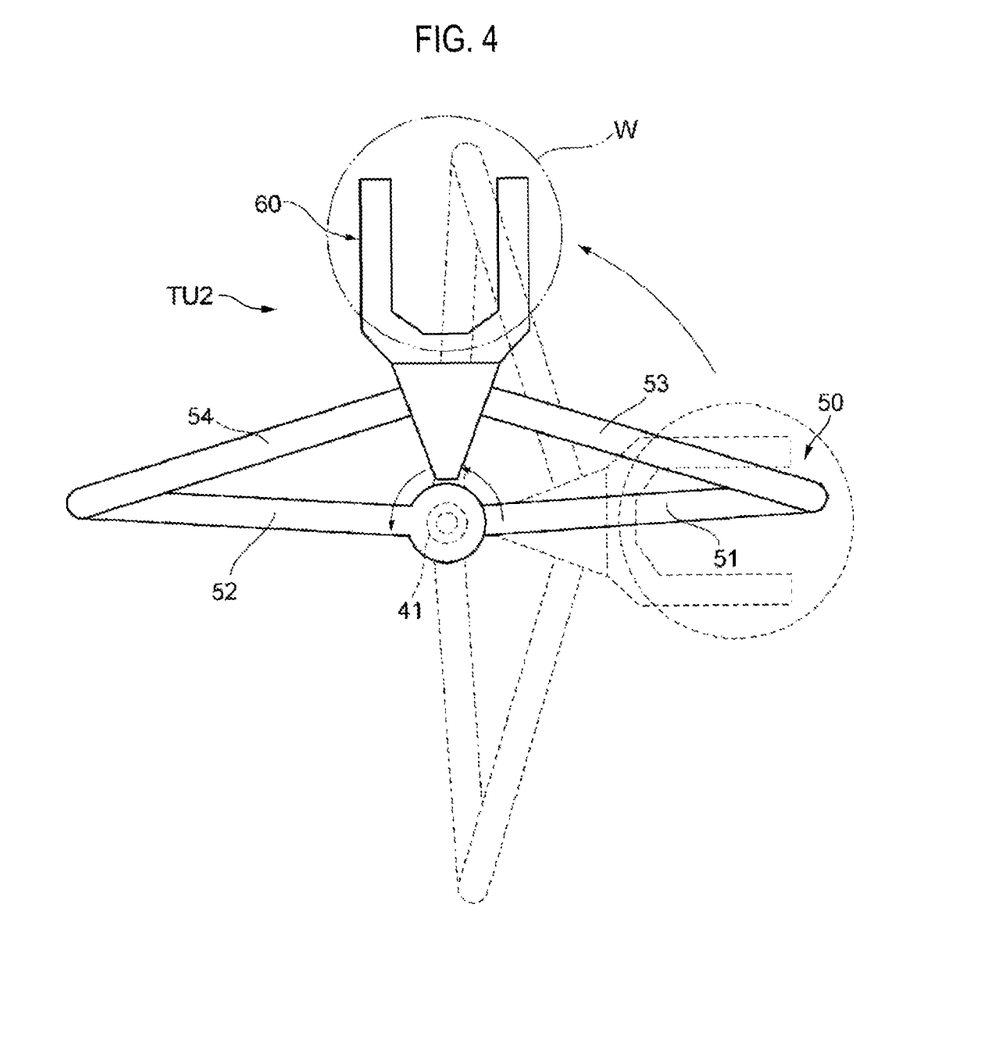
FIG. 4 is a plan view showing operations of arms of a transfer device according to some embodiments.
Figure 5:
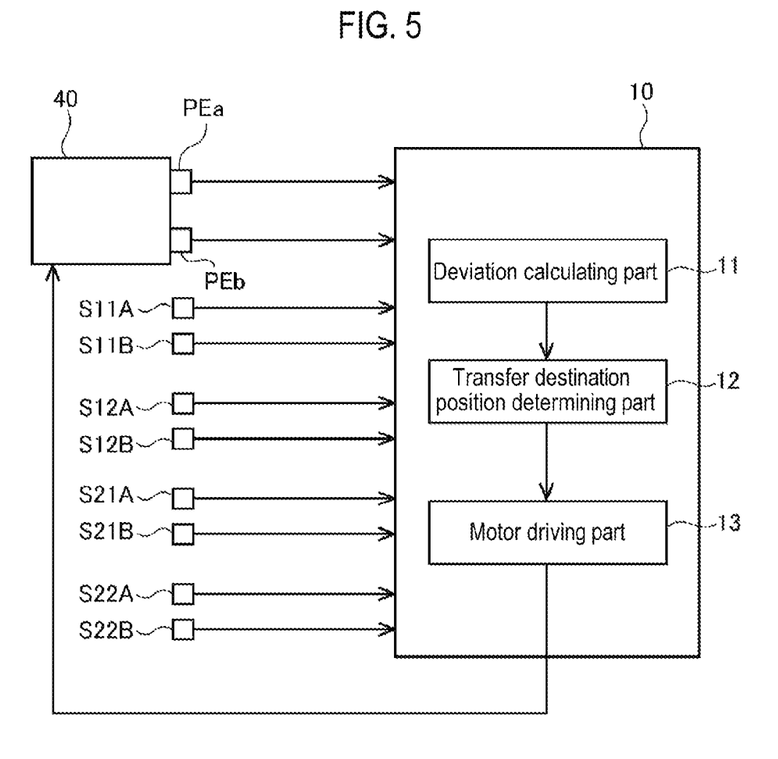
FIG. 5 is a functional block diagram showing a control system of a transfer device according to some embodiments.

Next, the transfer chamber 110 of one embodiment will be described. FIG. 2 is a sectional view taken along line II-II in FIG. 1. FIGS. 3 and 4 are plan views showing an operation of a transfer unit according to some embodiments. In FIG. 3, position detecting sensors S11A and S11B are representatively shown and a positional relationship between the position detecting sensors S11A and S11B and a transfer path of the substrate W is shown. FIG. 5 is a functional block diagram showing a control system of the transfer unit according to some embodiments. The following description will be given with reference to FIGS. 1 to 5.

The transfer chamber 110 includes a chamber wall 111, a transfer unit (used as a transfer means) TU2, position detecting sensors (used as position detecting units) S11A, S11B, S12A, S12B, S21A, S21B, S22A and S22B, and a control unit (used as a control means) 10. The chamber wall 111 has a substantially box shape and defines the transfer space S2 therein. The transfer space S2 is a space that can be kept in a decompressed state or a vacuum state as described above.

The transfer unit TU2 includes a driving part 40 and an arm 50. The driving part 40 includes a shaft portion 41 for driving the arm 50. The shaft portion 41 includes two rotating shafts 41a and 41b which are arranged along a single axial line. The rotating shaft 41a is a hollow shaft. The rotating shaft 41b passes through the hollow rotating shaft 41a. The driving part 40 rotates the rotating shafts 41a and 41b of the shaft portion 41 in the same direction or different directions based on control signals provided from the control unit 10. Further, the driving part 40 is provided with pulse encoders PEa and PEb. The pulse encoder PEa is connected to a motor for driving the rotating shaft 41a. The pulse encoder PEb is connected to a motor for driving the rotating shaft 41b.

The arm 50 includes proximal arms 51 and 52, distal arms 53 and 54 and a blade 60. One end portion of the proximal arm 51 is connected to the rotating shaft 41a of the shaft portion 41, and one end portion of the proximal arm 52 is connected to the rotating shaft 41b of the shaft portion 41. The other end portion of the proximal arm 51 is connected to one end portion of the distal arm 53, and the other end portion of the proximal arm 52 is connected to one end portion of the distal arm 54. The other end portions of the distal arms 53 and 54 are connected to the blade 60. The proximal arms 51 and 52, the distal arms 53 and 54 and the blade 60 constitute a frog leg type of transfer mechanism.

As shown in FIG. 3, the driving part 40 drives the proximal arms 51 and 52 to rotate in a direction in which they become closer to each other (a direction in which an angle formed by the proximal arms 51 and 52 becomes smaller) so that the arm 50 is extended. Alternatively, the driving part 40 drives the proximal arms 51 and 52 to rotate in a direction in which they become more remote from each other (a direction in which the angle formed by the proximal arms 51 and 52 becomes larger) so that the arm 50 is contracted. In addition, as shown in FIG. 4, the driving part 40 drives both the proximal arms 51 and 52 to rotate in the same direction so that the arm 50 is wholly rotated as indicated by an arrow.

In order to transfer the substrate W mounted on the blade 60 to one of the process modules PM11, PM12, PM21 and PM22, the transfer unit TU2 first rotates the entire arm 50 such that a distal side of the blade 60 faces a respective transfer destination process module with the arm 50 contracted. In the following description, a position of the substrate W when the blade 60 faces the respective transfer destination process module will be referred to as a transfer original position. Subsequently, the transfer unit TU2 extends the arm 50 toward the respective transfer destination process module and transfers the substrate W to the respective transfer destination process module. In the following description, a position at which the substrate W is transferred to the respective transfer destination process module by extending the arm 50 will be referred to as a transfer destination position.

By extending/contracting or rotating the arm 50, the transfer unit TU2 takes the substrate W out of the load lock chamber LL1 or LL2 and transfers the taken-out substrate W to one of the process modules PM11, PM12, PM21 and PM22 as the respective transfer destination process module. In addition, the transfer unit TU2 takes the substrate W out of the respective process module PM11, PM12, PM21 or PM22 and transfers the same to the load lock chamber LL1 or LL2. In some embodiments, the transfer unit TU2 may transfer the substrate W between the process modules PM11, PM12, PM21 and PM22.

The position detecting sensors S11A and S11B are installed in the chamber wall 111 near the gate valve G11 on the transfer path along which the substrate W is transferred to the process module PM11 (see the arrow indicated in FIG. 3). The position detecting sensor S11A includes a light transmitting part 70a and a light receiving part 70b. The light transmitting part 70a is installed in an upper wall 111a of the chamber wall 111 and the light receiving part 70b is installed in a lower wall 111b of the chamber wall 111. A laser beam L is emitted from the light transmitting part 70a toward the light receiving part 70b. The light receiving part 70b detects whether the laser beam L emitted from the light transmitting part 70a is received. Although in FIG. 2, only the light transmitting part 70a and the light receiving part 70b of the position detecting sensor S11A are shown, the position detecting sensor S11B also includes a light transmitting part and a light receiving part, like the position detecting sensor S11A. With this configuration, the laser beam L emitted from the light transmitting part 70a of the position detecting sensor S11A toward the light receiving part 70b thereof, and another laser beam emitted from the light transmitting part of the position detecting sensor S11B toward the light receiving part thereof, are interrupted at an instant of time at which the substrate W moves from the transfer original position toward the process module PM11 (or the transfer destination position).

Similar to the position detecting sensors S11A and S11B, the position detecting sensors S12A and S12B are installed in the chamber wall 111 near the gate valve G12 on a transfer path along which the substrate W is transferred to the process module PM12. The position detecting sensors S21A and S21B are installed in the chamber wall 111 near the gate valve G21 on a transfer path along which the substrate W is transferred to the process module PM21. The position detecting sensors S22A and S22B are installed in the chamber wall 111 near the gate valve G22 on a transfer path along which the substrate W is transferred to the process module PM22. In addition, like the light transmitting part 70a and the light receiving part 70b of the position detecting sensor S11A, each of the position detecting sensors S12A, S12B, S21A, S21B, S22A and S22B includes a light transmitting part and a light receiving part.

The substrate W is mounted on the blade 60. In some embodiments, the blade 60 may include a displacement prevention mechanism for preventing the substrate W from being displaced during the transfer of the substrate W.

The control unit 10 includes a deviation calculating part 11, a transfer destination position determining part 12 and a motor driving part 13. In some embodiments, the control unit 10, which may be implemented by a computer, executes programs using a CPU and a memory to realize various functions of the deviation calculating part 11, the transfer destination position determining part 12 and the motor driving part 13. The control unit 10 receives detection signals obtained at the position detecting sensors S11A, S11B, S12A, S12B, S21A, S21B, S22A and S22B, and the pulse encoders PEa and PEb.

The deviation calculating part 11 calculates a deviation (in the X- and Y-directions) between the center position of the substrate W which is mounted at a correct position (predetermined position in design) on the blade 60 and the actual center position of the substrate W mounted on the blade 60. In some embodiments, the deviation calculating part 11 can calculate rotational speeds of the motors for driving the rotating shafts 41a and 41b based on signals provided from the pulse encoders PEa and PEb. That is, the deviation calculating part 11 can estimate a state of the arm 50 based on the signals provided from the pulse encoders PEa and PEb. Accordingly, based on the signals provided from the pulse encoders PEa and PEb, the deviation calculating part 11 can calculate the center position of the substrate W when the substrate W is mounted at the correct position on the blade 60.

In addition, in some embodiments, the deviation calculating part 11 can calculate the actual center position of the substrate W during the transfer of the substrate W, based on signals provided from the position detecting sensors S11A, S11B, S12A, S12B, S21A, S21B, S22A and S22B. As an example, when the substrate W is being transferred to the process module PM11, the substrate W interrupts at an instant of time the laser beam L which is being emitted from the light transmitting part 70a of the position detecting sensor S11A toward the light receiving part 70b thereof, and the other laser beam which is being emitted from the light transmitting part of the position detecting sensor S11B toward the light receiving part thereof. With this configuration, the deviation calculating part 11 can obtain a trajectory of each of the laser beams emitted onto the substrate W, based on a time interval in which the laser beam L in the position detecting sensor S11A is interrupted by the substrate W and a time interval in which the other laser beam in the position detecting sensor S11B is interrupted by the substrate W. Thus, the deviation calculating part 11 calculates the actual center position of the substrate W based on the obtained trajectories. Calculating the actual center position of the substrate W is not limited to the aforementioned method but may employ other various conventional methods.

The deviation calculating part 11 calculates the deviation of the center position of the substrate W mounted on the blade 60 during the transfer of the substrate W, based on the center position of the substrate W (when being mounted at a correct position on the blade 60) which is calculated based on the signals provided from the pulse encoders PEa and PEb and the actual center position of the substrate W which is calculated based on the detection signals provided from the position detecting sensors S11A, S11B and the like.

The transfer destination position determining part 12 determines a transfer destination position to which the substrate W is transferred. In one embodiment, the transfer destination position determining part 12 determines the transfer destination position of the substrate W when the substrate W lies at the transfer original position, based on the center position of the substrate W mounted at the correct position on the blade 60. When the substrate W is mounted and deviates from the correct position on the blade 60, the substrate W is transferred while deviating from the transfer destination position. For this reason, based on the deviation calculated by the deviation calculating part 11, the transfer destination position determining part 12 corrects the transfer destination position such that the substrate W is properly transferred to the corrected transfer destination position. That is, while the substrate W is being transferred from the transfer original position to the transfer destination position, the transfer destination position is corrected so that the transfer destination position of the substrate W is varied during the transfer.

Figure 6:
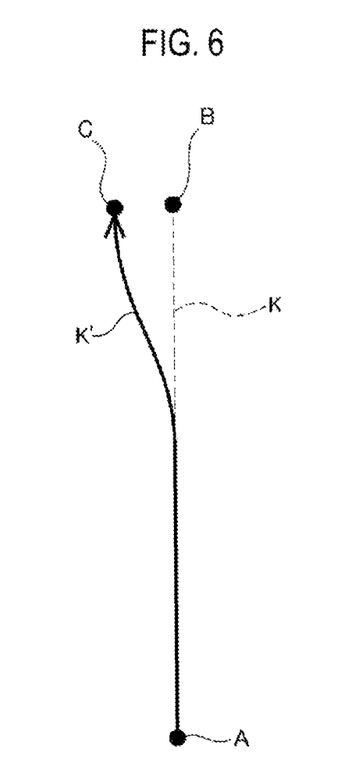
FIG. 6 shows a trajectory of a center position of a substrate according to some embodiments.

FIG. 6 shows a trajectory of the center position of the substrate W. As shown in FIG. 6, the transfer destination position of the substrate W is changed while the substrate W is being transferred to a transfer destination position B (an initial transfer destination position) determined when the substrate W lies at the transfer original position A, so that the substrate W is eventually transferred to a corrected transfer destination position C. That is, in the middle of an initial transfer path K along which the substrate W is traveling from the transfer original position A to the initial transfer destination position B, the path along which the substrate W is traveling is corrected to the transfer destination position C while deviating from the initial transfer path K.

In some embodiments, the transfer destination position determining part 12 determines a modified transfer path K of the substrate W by correcting the initial transfer destination position such that the trajectory of the center position of the substrate W which travels to the corrected transfer destination position is in the shape of a cam curve. The cam curve used herein is a smoothly curved line defined by only a curve. In some embodiments, the cam curve may be replaced with a pattern defined by a straight line and a curved line which are smoothly connected to each other.

In some embodiments, the transfer destination position determining part 12 may obtain the modified transfer path K of the substrate W by correcting a calculation formula for calculating a predetermined transfer path based on the deviation obtained at the deviation calculating part 11. Alternatively, the transfer destination position determining part 12 may hold a data table representing various types of transfer paths and may select the optimal transfer path from the data table as the modified transfer path K with reference to a positional relationship between a current position of the substrate W and the corrected transfer destination position.

The motor driving part 13 controls the motors for driving the rotating shafts 41a and 41b of the driving part 40 such that the substrate W is transferred to the corrected transfer destination position determined by the transfer destination position determining part 12. In one embodiment, once the modified transfer path K of the substrate W is determined by the transfer destination position determining part 12, the motor driving part 13 may control the motors for driving the rotating shafts 41a and 41b of the driving part 40 such that the center position of the substrate W is drawn along the modified transfer path K.

Figure 7:
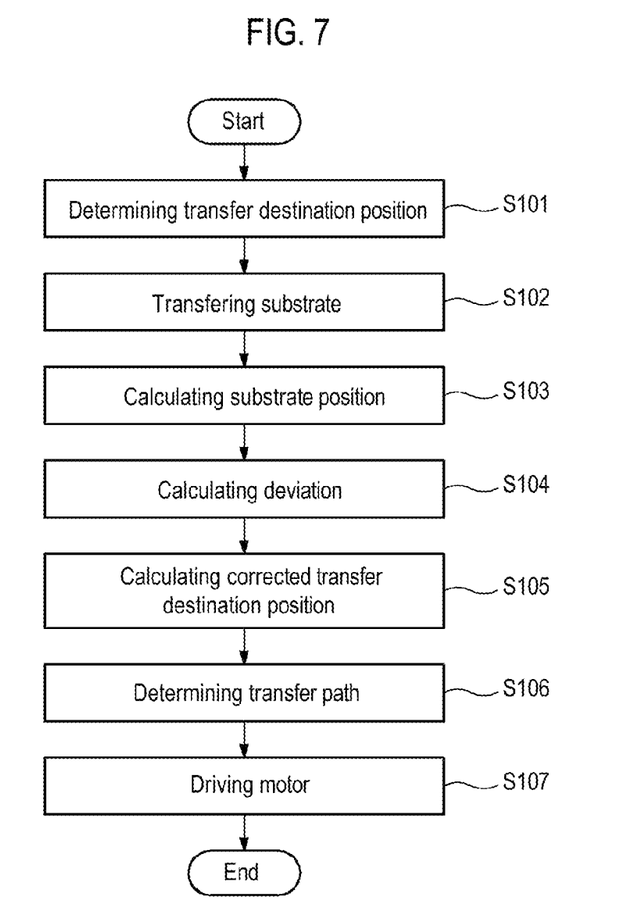
FIG. 7 is a flow chart showing steps of a substrate transferring method according to some embodiments.

Next, a flow of processes performed by the control unit 10 will be described. A case where the substrate W is transferred into the process module PM11 will be described. FIG. 7 is a flow chart showing a substrate transfer method according to some embodiments. First, the transfer destination position determining part 12 of the control unit 10 determines the initial transfer destination position B of the substrate W in a state where the substrate W lies at the transfer original position A (Step S101). The motor driving part 13 drives the motors of the driving part 40 such that the substrate W is transferred from the transfer original position to the initial transfer destination position B determined by the transfer destination position determining part 12 (Step S102).

When the interruption of the laser beams by the substrate W is detected by the position detecting sensors S11A and S11B while the substrate W is transferred, the deviation calculating part 11 calculates the actual center position of the substrate W based on the detection signals obtained at the position detecting sensors S11A and S11B and the like (Step S103: position detecting step). Subsequently, the deviation calculating part 11 calculates a deviation of the center position of the substrate W based on the calculated actual center position of the substrate W and the center position of the substrate W (when being mounted at a correct position on the blade 60) which is calculated based on the signals provided from the pulse encoders PEa and PEb (Step S104).

Thereafter, the transfer destination position determining part 12 calculates the corrected transfer destination position C based on the deviation calculated by the deviation calculating part 11 (Step S105: step of calculating the corrected transfer destination position). In one embodiment, the transfer destination position determining part 12 determines the modified transfer path K along which the substrate W travels to the corrected transfer destination position C (Step S106).

Subsequently, the motor driving part 13 controls the motors of the driving part 40 such that the substrate W travels to the corrected transfer destination position determined by the transfer destination position determining part 12. In some embodiments, upon determination of the modified transfer path K, the motor driving part 13 controls the motors of the driving part 40 such that the center position of the substrate W is drawn along the modified transfer path K' (Step S107: transfer control step).

Figure 8:
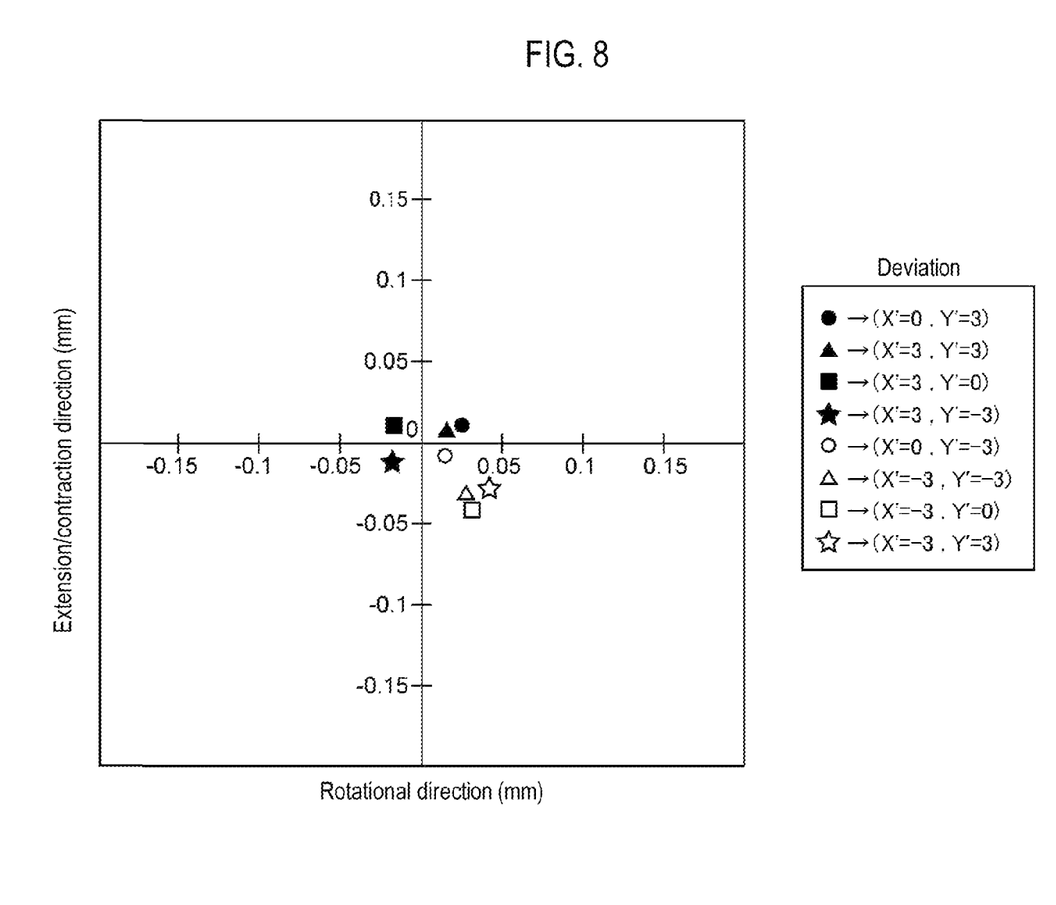
FIG. 8 is a view showing transfer errors of a transfer unit according to an embodiment.

A case where the substrate W is transferred using the transfer unit TU2 configured as above will now be described as another embodiment. In this embodiment, in a state where the substrate W is mounted to deviate on the blade 60 of the transfer unit TU2, the initial transfer destination position of the substrate W is corrected during the transfer of the substrate W such that the substrate W is transferred to a correct destination position. FIG. 8 shows transfer errors which represent that the substrate W deviates from the correct destination position (the origin (0,0)) when the substrate W is transferred while being mounted at a plurality of (e.g., eight) positions on the blade 60.

In FIG. 8, a black circle indicates a transfer error when the substrate W is transferred while being mounted at a position deviating by 0 mm in a rotational direction (X' direction) of the arm 50 and by 3 mm in an extension/contraction direction (Y' direction) of the arm 50 from an original position at which the substrate W is correctly mounted on the blade 60 (see FIG. 3). Similarly, a black triangle indicates a transfer error when the substrate W is transferred while being mounted at a position deviating by 3 mm in the rotational direction (X' direction) of the arm 50 and by 3 mm in the extension/contraction direction (Y' direction) of the arm 50. A black square indicates a transfer error when the substrate W is transferred while being mounted at a position deviating by 3 mm in the rotational direction (X' direction) of the arm 50 and by 0 mm in the extension/contraction direction (Y' direction) of the arm 50. A black star indicates a transfer error when the substrate W is transferred while being mounted at a position deviating by 3 mm in the rotational direction (X' direction) of the arm 50 and by −3 mm in the extension/contraction direction (Y direction) of the arm 50. A white circle indicates a transfer error when the substrate W is transferred while being mounted at a position deviating by 0 mm in the rotational direction (X' direction) of the arm 50 and by −3 mm in the extension/contraction direction (Y' direction) of the arm 50. A white triangle indicates a transfer error when the substrate W is transferred while being mounted at a position deviating by −3 mm in the rotational direction (X' direction) of the arm 50 and by −3 mm in the extension/contraction direction (Y' direction) of the arm 50. A white square indicates a transfer error when the substrate W is transferred while being mounted at a position deviating by −3 mm in the rotational direction (X' direction) of the arm 50 and by 0 mm in the extension/contraction direction (Y' direction) of the arm 50. A white star indicates a transfer error when the substrate W is transferred while being mounted at a position deviating by −3 mm in the rotational direction (X' direction) of the arm 50 and by 3 mm in the extension/contraction direction (Y' direction) of the arm 50.

In this embodiment, a period of time between the start and end of the transfer of the substrate W using the transfer unit TU2 was 1.39 seconds.

As shown in FIG. 8, the transfer errors of the transfer unit TU2 in this embodiment is about 0.05 mm or less. That is, even when the substrate W is mounted at positions deviated from the correct position on the blade 60, the initial transfer destination position can be corrected during the transfer of the substrate W, thus transferring the substrate W to the corrected transfer destination position with high precision along a smooth substrate movement trajectory.

Figure 9:
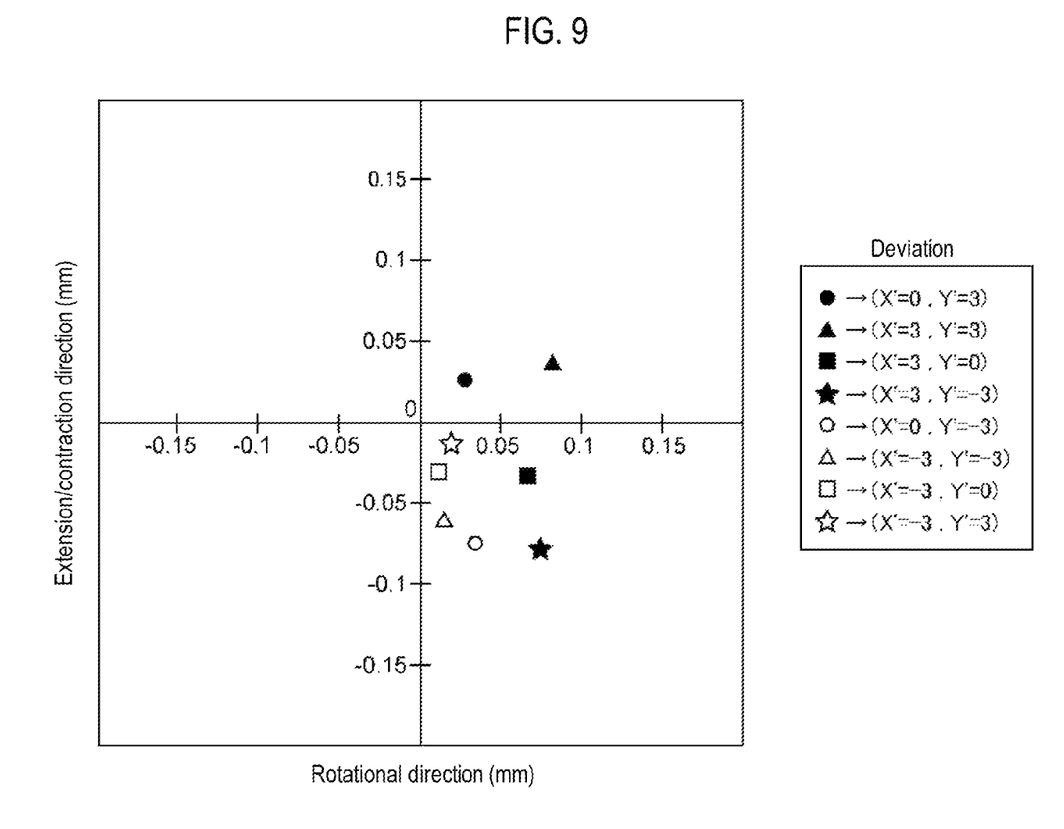
FIG. 9 is a view showing transfer errors of a transfer unit according to a comparative example.

A comparative example will now be described. This comparative example involves modifying the method of correcting the initial transfer destination position using the transfer unit TU2 employed in the above embodiment. In the comparative example, after the substrate W is transferred to the initial transfer destination position determined when the substrate W lies at the transfer original position, a position of the substrate W is corrected based on a deviation detected by position detecting sensors. FIG. 9 shows transfer errors which represent that the substrate W deviates from the correct destination position (the origin (0,0)) when the substrate W is transferred using the transfer unit TU2 in the comparative example. Like the above embodiment, in the comparative example, the substrate W is transferred while being mounted at a plurality of (e.g., eight) positions on the blade 60. In FIG. 9, symbols such as a black circle are identical to those described in the embodiment of FIG. 8.

As shown in FIG. 9, the transfer errors of the transfer unit TU2 in the comparative example is about 0.09 mm or less.

That is, the transfer errors in the comparative example can be appreciated to be larger than the transfer errors in the above embodiment.

As described above, in the embodiment of the present disclosure, when the substrate W is mounted on the blade 60 with a deviation from the correct position, the deviation of the substrate W is calculated during the transfer of the substrate W. The deviation of the substrate W is calculated based on the actual center position of the substrate W and the center position of the substrate W in a state where the substrate W is mounted at the correct position on the blade 60. Thus, even if the transfer path is deviated during the transfer of the substrate W, it is possible to correctly calculate the deviation of the substrate W mounted on the blade 60. Subsequently, the corrected transfer destination position is calculated based on the calculated deviation. The initial transfer destination position is changed to the corrected transfer destination position during the transfer of the substrate W so that the substrate W is directly transferred to the corrected transfer destination position. With this configuration, for example, even if a distance between the initial transfer destination position set at the start of the transfer of the substrate W and the corrected transfer destination position is short, a distance between a position of the substrate W when the corrected transfer destination position is calculated during the transfer of the substrate W and the corrected transfer destination position, can be larger than the distance between the initial transfer destination position and the corrected transfer destination position. That is, it is possible to lengthen a transfer distance of the substrate W to obtain the corrected transfer destination position. This reduces deviation errors of the substrate W from the corrected transfer destination position, which are caused by mechanical properties such as linearity of the transfer unit TU2, thereby transferring the substrate W along a smooth substrate movement trajectory with high precision.

In some embodiments, when the substrate W is transferred to the corrected transfer destination position, the control unit 10 may control the transfer unit TU2 such that the movement trajectory of the substrate W has a curved path. With this configuration, when the substrate W is transferred to the corrected transfer destination position, it is possible to prevent a sudden change in acceleration, which may be caused by a change in movement direction of the substrate W. This prevents a positional deviation of the substrate W during the transfer of the substrate W, which makes it possible to transfer the substrate W along the smooth substrate movement trajectory with high precision.

The present disclosure is not limited to the above configurations. As an example, the aforementioned processing system is illustrative only, and the number of elements such as the mounting tables, the containers, the process modules and the like and a positional relationship therebetween are not limited to the configuration of the aforementioned processing system.

In some embodiments, the control unit 10, when correcting the initial transfer destination position, may control the transfer unit TU2 to transfer the substrate W along a smooth substrate movement trajectory without causing a sudden change in acceleration when the substrate W is transferred.

In addition, while in the above embodiment, the position detecting sensors S11A, S11B, S12A, S12B, S21A, S21B, S22A and S22B has been described to be installed in the chamber wall 111 of the transfer chamber 110, the present disclosure is not limited thereto. Alternatively, the sensors may be installed in the gate valves G11, G12, G21 and G22 or the process modules PM11, PM12, PM21 and PM22.

As described above, according to various embodiments of the present disclosure, it is possible to provide a transfer device and a method of transferring a substrate with high precision.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A transfer device comprising:
   a transfer unit configured to transfer a substrate mounted on the transfer unit from a transfer original position to a corrected transfer destination position;
   a plurality of position detecting units installed between the transfer original position and the corrected transfer destination position and configured to detect a position of the substrate which is being transferred by the transfer unit; and
   a control unit configured to calculate the corrected transfer destination position by calculating a position of the substrate when the substrate is mounted on a predetermined position of the transfer unit set before the start of the transfer of the substrate based on a position information of the transfer unit and correcting an initial transfer destination position set at the start of the transfer of the substrate, based on a deviation between (a) the position of the substrate detected by the position detecting units and (b) the position of the substrate when the substrate is mounted on the predetermined position of the transfer unit set before the start of the transfer of the substrate, before the substrate is transferred to the initial transfer destination position, and configured to control the transfer unit to transfer the substrate to the corrected transfer destination position along a transfer path produced by modifying an initial transfer path which is oriented from the transfer original position to the initial transfer destination position.

2. The transfer device of claim 1, wherein the control unit controls the transfer unit such that a movement trajectory of the substrate orienting to the corrected transfer destination position in the initial transfer path has a curved fashion.

3. The transfer device of claim 1, wherein the control unit controls the transfer unit such that a movement trajectory of the substrate orienting to the corrected transfer destination position in the initial transfer path has a smooth line fashion.

4. A method of transferring a substrate from a transfer original position to a corrected transfer destination position using a transfer unit, comprising:
   detecting a position of the substrate transferred by the transfer unit during the transfer of the substrate, the substrate being mounted on the transfer unit;
   calculating a position of the substrate when the substrate is mounted on a predetermined position of the transfer unit set before the start of the transfer of the substrate based on a position information of the transfer unit;
   correcting an initial transfer destination position based on a deviation between (a) the position of the substrate detected at the detecting and (b) the position of the substrate when the substrate is mounted on the predetermined position of the transfer unit set before the start of the transfer of the substrate, before the substrate is transferred to the initial transfer destination position to provide the corrected transfer destination position, the initial transfer destination position being set at the start of the transfer of the substrate; and
   controlling the transfer unit such that the substrate is transferred to the corrected transfer destination position along a transfer path produced by modifying an initial transfer path which is oriented from the transfer original position to the initial transfer destination position.

5. The method of claim 4, wherein controlling the transfer unit includes controlling the transfer unit such that a movement trajectory of the substrate orienting to the corrected transfer destination position in the initial transfer path has a curved fashion.

6. The method of claim 5, wherein the controlling includes controlling the transfer unit such that the movement trajectory of the substrate orienting to the corrected transfer destination position in the initial transfer path has a smooth line fashion.

* * * * *